(12) United States Patent
Pagaila et al.

(10) Patent No.: US 8,518,746 B2
(45) Date of Patent: Aug. 27, 2013

(54) SEMICONDUCTOR DEVICE AND METHOD OF FORMING TSV SEMICONDUCTOR WAFER WITH EMBEDDED SEMICONDUCTOR DIE

(75) Inventors: Reza A. Pagaila, Singapore (SG); Yaojian Lin, Singapore (SG); Seung Uk Yoon, Singapore (SG)

(73) Assignee: STATS ChipPAC, Ltd., Singapore (SG)

( * ) Notice: Subject to any disclaimer, the term of this patent is extended or adjusted under 35 U.S.C. 154(b) by 247 days.

(21) Appl. No.: 12/874,787

(22) Filed: Sep. 2, 2010

(65) Prior Publication Data

US 2012/0056312 A1    Mar. 8, 2012

(51) Int. Cl.
*H01L 21/00*    (2006.01)
*H01L 21/4763*    (2006.01)

(52) U.S. Cl.
USPC ........... 438/112; 438/107; 438/109; 438/127; 438/618

(58) Field of Classification Search
USPC ............. 438/106, 107, 108, 118, 119, 109, 438/112, 122, 127, 618; 257/684, 678, 690, 257/E21.502, E23.116
See application file for complete search history.

(56) References Cited

U.S. PATENT DOCUMENTS

| | | | |
|---|---|---|---|
| 5,241,456 A | 8/1993 | Marcinkiewicz et al. | |
| 5,250,843 A | 10/1993 | Eichelberger | |
| 5,353,498 A | 10/1994 | Fillion et al. | |
| 5,841,193 A | 11/1998 | Eichelberger | |
| 6,498,387 B1 | 12/2002 | Yang | |
| 7,170,152 B2 | 1/2007 | Huang et al. | |
| 7,489,025 B2 | 2/2009 | Chen et al. | |
| 7,518,229 B2 | 4/2009 | Cotte et al. | |
| 7,619,901 B2 | 11/2009 | Eichelberger et al. | |
| 7,858,441 B2 * | 12/2010 | Lin et al. ................... | 438/109 |
| 7,989,950 B2 * | 8/2011 | Park et al. ................. | 257/724 |
| 2002/0168797 A1 * | 11/2002 | DiStefano et al. ........ | 438/106 |
| 2003/0042587 A1 * | 3/2003 | Lee ........................... | 257/678 |
| 2009/0302435 A1 * | 12/2009 | Pagaila et al. ............ | 257/659 |
| 2010/0006994 A1 * | 1/2010 | Shim et al. ................ | 257/676 |
| 2010/0133704 A1 * | 6/2010 | Marimuthu et al. ...... | 257/778 |

* cited by examiner

*Primary Examiner* — Walter H Swanson
*Assistant Examiner* — Wilner Jean Baptiste
(74) *Attorney, Agent, or Firm* — Robert D. Atkins; Patent Law Group: Atkins & Associates, P.C.

(57) ABSTRACT

A semiconductor device has a TSV semiconductor wafer with a cavity formed in a first surface of the wafer. A second cavity can be formed in a second surface of the wafer. A plurality of semiconductor die is mounted within the cavities. The semiconductor die can be mounted side-by-side and/or stacked within the cavity. Conductive TSV can be formed through the die. An encapsulant is deposited within the cavity over the die. A CTE of the die is similar to a CTE of the encapsulant. A first interconnect structure is formed over a first surface of the encapsulant and wafer. A second interconnect structure is formed over a second surface of the encapsulant and wafer. The first and second interconnect structure are electrically connected to the TSV wafer. A second semiconductor die can be mounted over the first interconnect structure with encapsulant deposited over the second die.

20 Claims, 12 Drawing Sheets

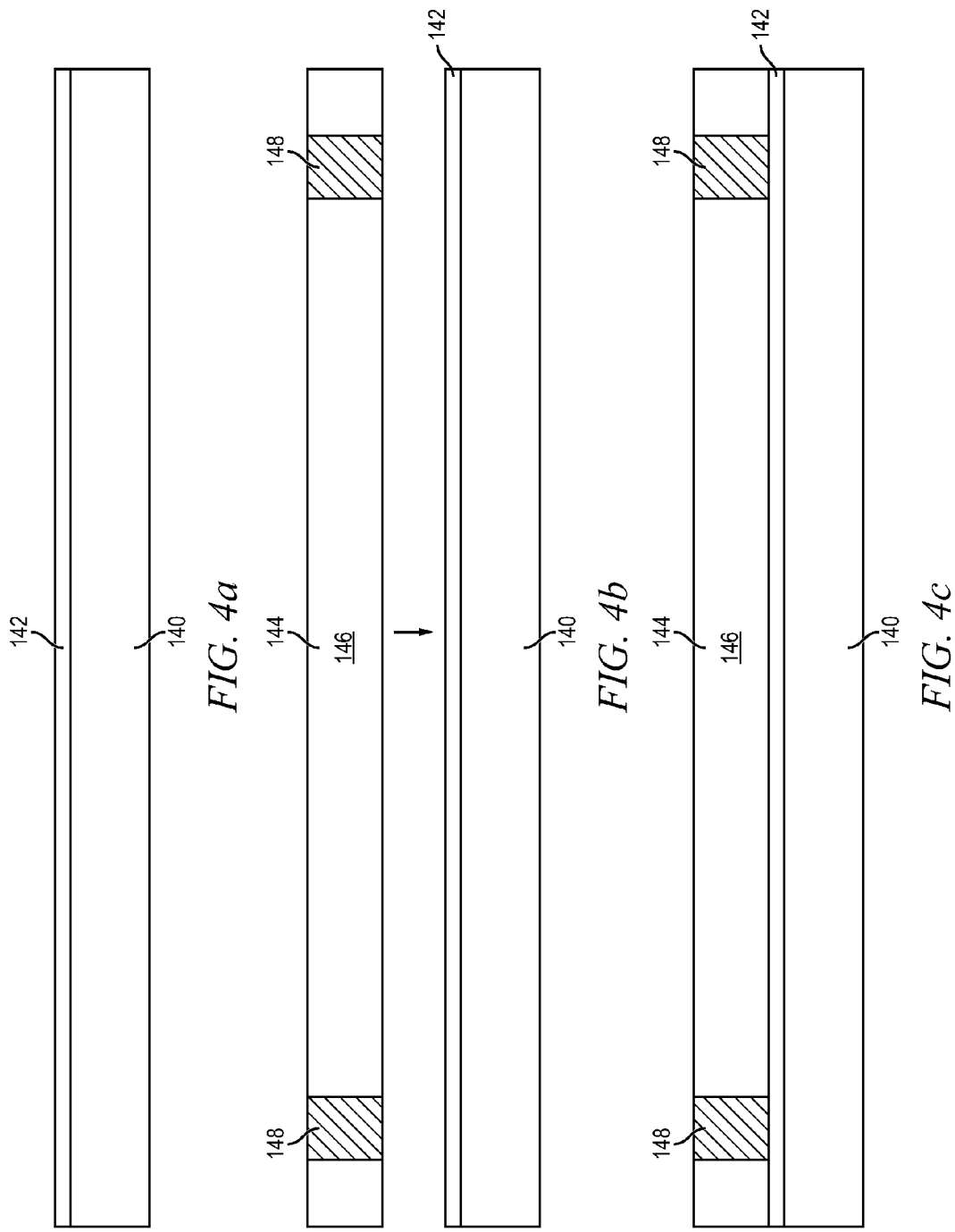

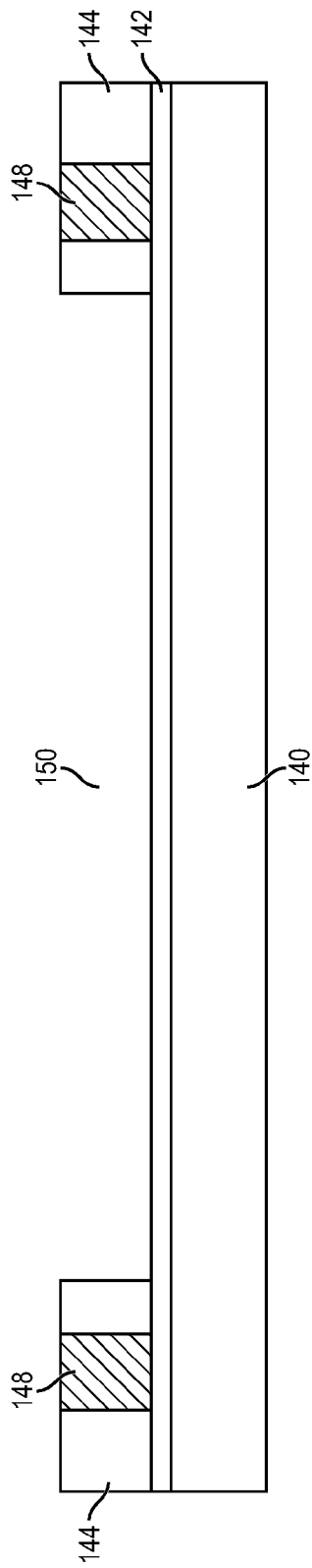
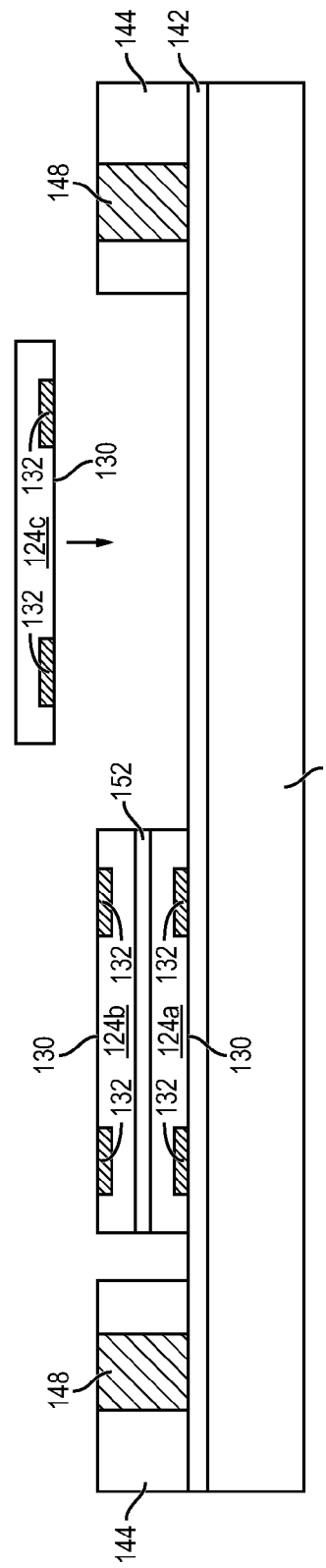

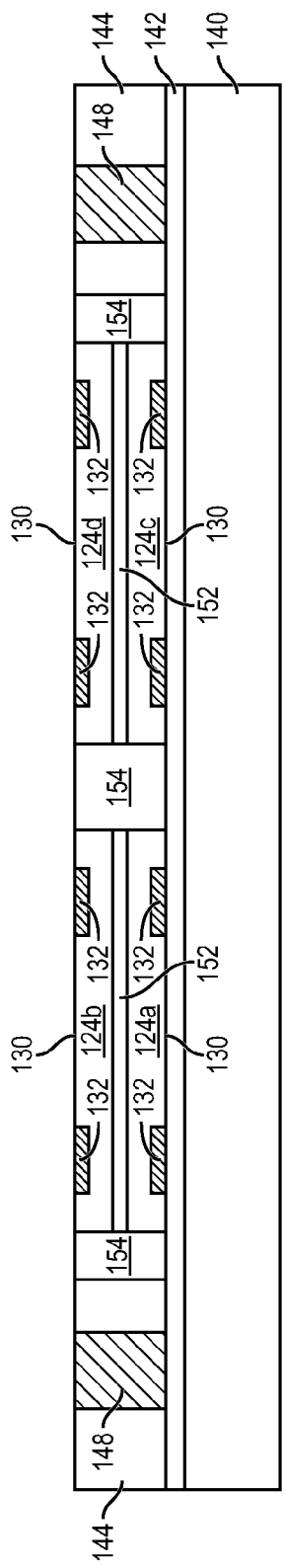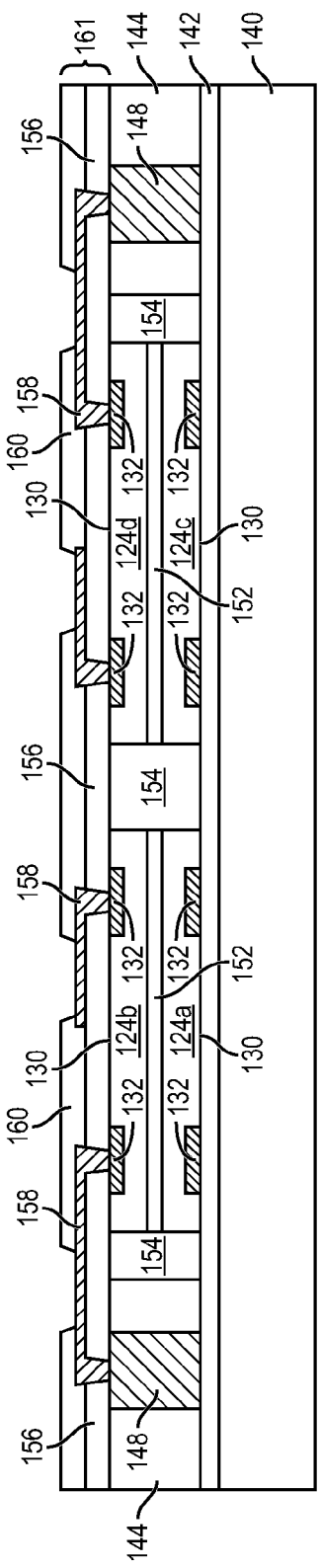

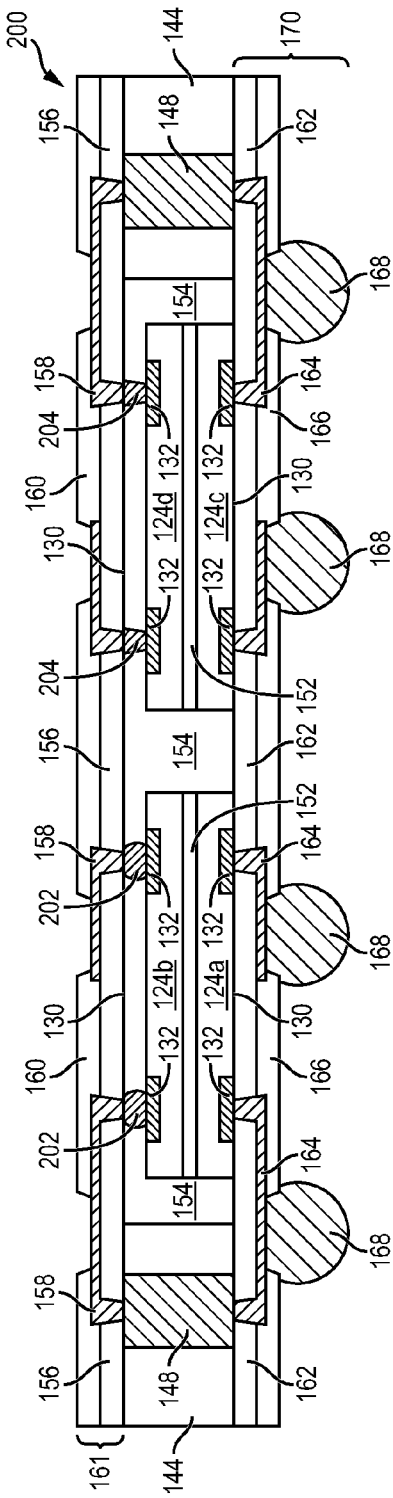
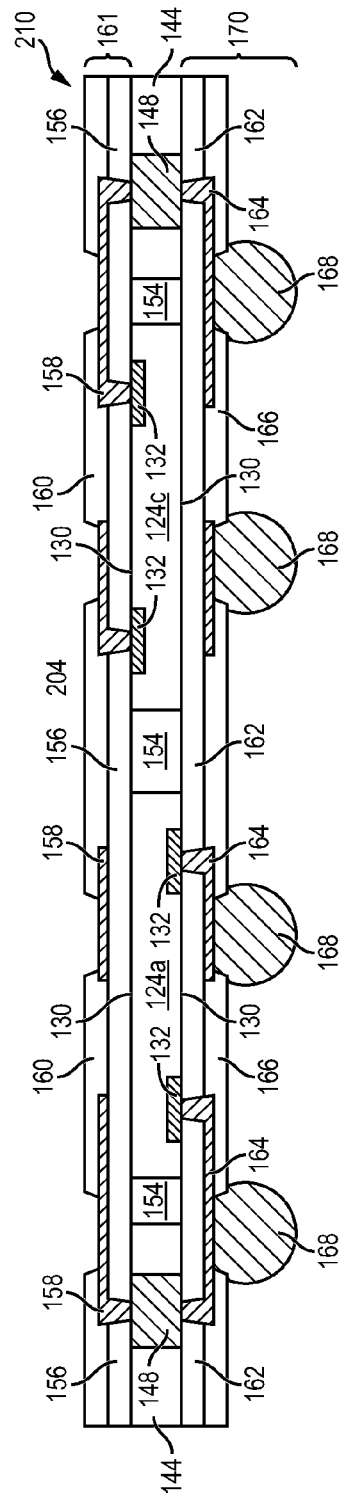
FIG. 9
FIG. 10

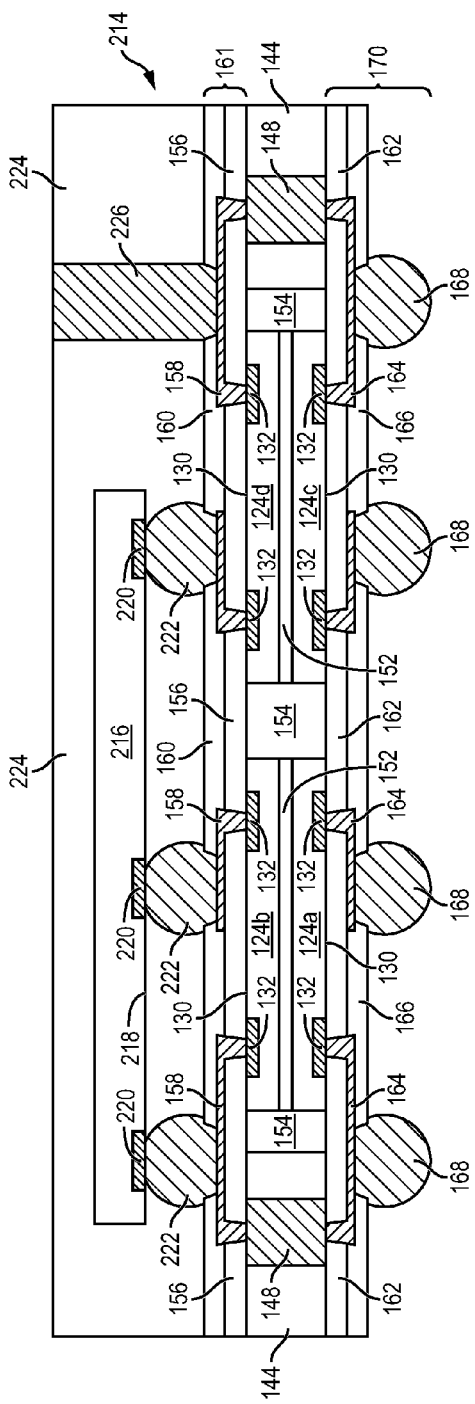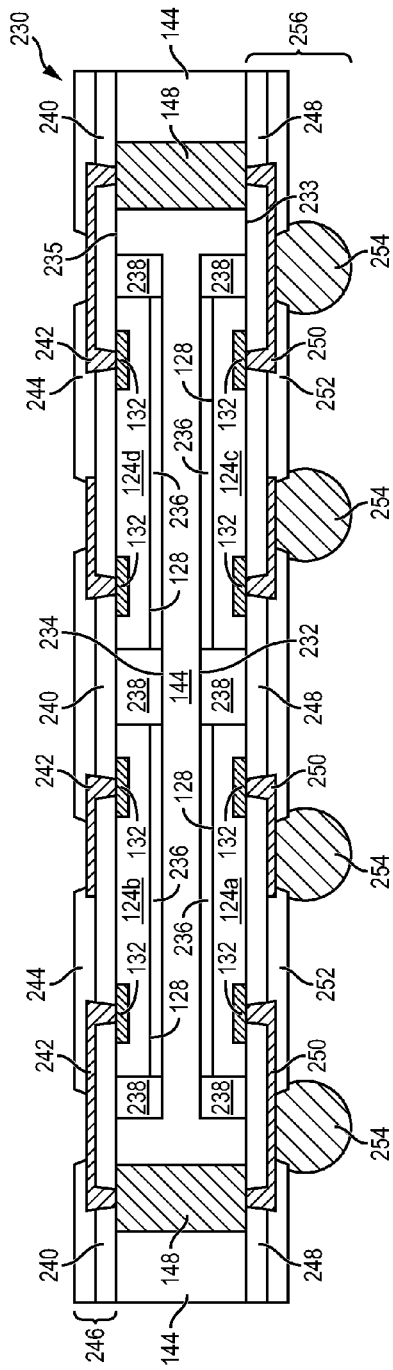

SEMICONDUCTOR DEVICE AND METHOD OF FORMING TSV SEMICONDUCTOR WAFER WITH EMBEDDED SEMICONDUCTOR DIE

FIELD OF THE INVENTION

The present invention relates in general to semiconductor devices and, more particularly, to a semiconductor device and method of forming a TSV semiconductor wafer with side-by-side and/or stacked semiconductor die embedded within a cavity.

BACKGROUND OF THE INVENTION

Semiconductor devices are commonly found in modern electronic products. Semiconductor devices vary in the number and density of electrical components. Discrete semiconductor devices generally contain one type of electrical component, e.g., light emitting diode (LED), small signal transistor, resistor, capacitor, inductor, and power metal oxide semiconductor field effect transistor (MOSFET). Integrated semiconductor devices typically contain hundreds to millions of electrical components. Examples of integrated semiconductor devices include microcontrollers, microprocessors, charged-coupled devices (CCDs), solar cells, and digital micro-mirror devices (DMDs).

Semiconductor devices perform a wide range of functions such as signal processing, high-speed calculations, transmitting and receiving electromagnetic signals, controlling electronic devices, transforming sunlight to electricity, and creating visual projections for television displays. Semiconductor devices are found in the fields of entertainment, communications, power conversion, networks, computers, and consumer products. Semiconductor devices are also found in military applications, aviation, automotive, industrial controllers, and office equipment.

Semiconductor devices exploit the electrical properties of semiconductor materials. The atomic structure of semiconductor material allows its electrical conductivity to be manipulated by the application of an electric field or base current or through the process of doping. Doping introduces impurities into the semiconductor material to manipulate and control the conductivity of the semiconductor device.

A semiconductor device contains active and passive electrical structures. Active structures, including bipolar and field effect transistors, control the flow of electrical current. By varying levels of doping and application of an electric field or base current, the transistor either promotes or restricts the flow of electrical current. Passive structures, including resistors, capacitors, and inductors, create a relationship between voltage and current necessary to perform a variety of electrical functions. The passive and active structures are electrically connected to form circuits, which enable the semiconductor device to perform high-speed calculations and other useful functions.

Semiconductor devices are generally manufactured using two complex manufacturing processes, i.e., front-end manufacturing, and back-end manufacturing, each involving potentially hundreds of steps. Front-end manufacturing involves the formation of a plurality of die on the surface of a semiconductor wafer. Each die is typically identical and contains circuits formed by electrically connecting active and passive components. Back-end manufacturing involves singulating individual die from the finished wafer and packaging the die to provide structural support and environmental isolation.

One goal of semiconductor manufacturing is to produce smaller semiconductor devices. Smaller devices typically consume less power, have higher performance, and can be produced more efficiently. In addition, smaller semiconductor devices have a smaller footprint, which is desirable for smaller end products. A smaller die size may be achieved by improvements in the front-end process resulting in die with smaller, higher density active and passive components. Back-end processes may result in semiconductor device packages with a smaller footprint by improvements in electrical interconnection and packaging materials.

In a conventional fan-out wafer level chip scale package (Fo-WLCSP), semiconductor die are commonly embedded in an encapsulant over a temporary carrier, known as a reconfigured wafer. A mismatch between the coefficient of thermal expansion (CTE) of the encapsulant and carrier can cause warpage in the reconfigured wafer. A CTE difference between the encapsulant and semiconductor die can cause delamination due to the thermal stress.

SUMMARY OF THE INVENTION

A need exists to provide a Fo-WLCSP with embedded semiconductor die without inducing warpage or delamination. Accordingly, in one embodiment, the present invention is a method of making a semiconductor device comprising the steps of providing a semiconductor wafer having a plurality of conductive TSV formed through the semiconductor wafer, mounting the semiconductor wafer to a carrier, forming a cavity in the semiconductor wafer between the conductive TSV, mounting a plurality of semiconductor die within the cavity of the semiconductor wafer, depositing an encapsulant within the cavity over the semiconductor die, forming a first interconnect structure over a first surface of the encapsulant and semiconductor wafer, removing the carrier, and forming a second interconnect structure over a second surface of the encapsulant and semiconductor wafer opposite the first surface. The first and second interconnect structures are electrically connected to the conductive TSV.

In another embodiment, the present invention is a method of making a semiconductor device comprising the steps of providing a semiconductor wafer, forming a first cavity in a first surface of the semiconductor wafer, mounting a first semiconductor die within the first cavity of the semiconductor wafer, depositing a first encapsulant within the first cavity over the first semiconductor die, forming a first interconnect structure over a first surface of the first encapsulant and semiconductor wafer, and forming a second interconnect structure over a second surface of the first encapsulant and semiconductor wafer opposite the first surface of the first encapsulant.

In another embodiment, the present invention is a method of making a semiconductor device comprising the steps of providing a substrate having a plurality of conductive TSV formed through the substrate, forming a first cavity in a first surface of the substrate, mounting a first semiconductor die within the first cavity of the substrate, depositing a first encapsulant within the first cavity over the first semiconductor die, and forming a first interconnect structure over a first surface of the first encapsulant and substrate. The first interconnect structure is electrically connected to the conductive TSV.

In another embodiment, the present invention is a semiconductor device comprising a semiconductor wafer including a plurality of conductive TSV formed through the semiconductor wafer and a first cavity formed in a first surface of the semiconductor wafer. A first semiconductor die is mounted within the first cavity of the semiconductor wafer. An encapsulant is deposited within the first cavity over the first semiconductor die. A first interconnect structure is formed over a first surface of the encapsulant and semiconductor wafer. A second interconnect structure is formed over a second surface of the encapsulant and semiconductor wafer opposite the first surface of the encapsulant and semiconductor wafer. The first and second interconnect structures are electrically connected to the conductive TSV.

BRIEF DESCRIPTION OF THE DRAWINGS

FIGS. 4a-4k illustrate a process of forming a TSV semiconductor wafer with side-by-side stacked semiconductor die embedded within a cavity;

FIG. 9 illustrates the TSV semiconductor wafer with side-by-side stacked back-to-back semiconductor die embedded within a cavity deeper than the stacked semiconductor die;

FIG. 10 illustrates the TSV semiconductor wafer with side-by-side single semiconductor die embedded within a cavity;

FIG. 11 illustrates a semiconductor die mounted over the TSV semiconductor wafer with side-by-side stacked face-to-face semiconductor die embedded within a cavity; and FIG. 12 illustrates the TSV semiconductor wafer with side-by-side single semiconductor die embedded within cavities formed in opposing surfaces of the semiconductor wafer.

DETAILED DESCRIPTION OF THE DRAWINGS

Figure 1:
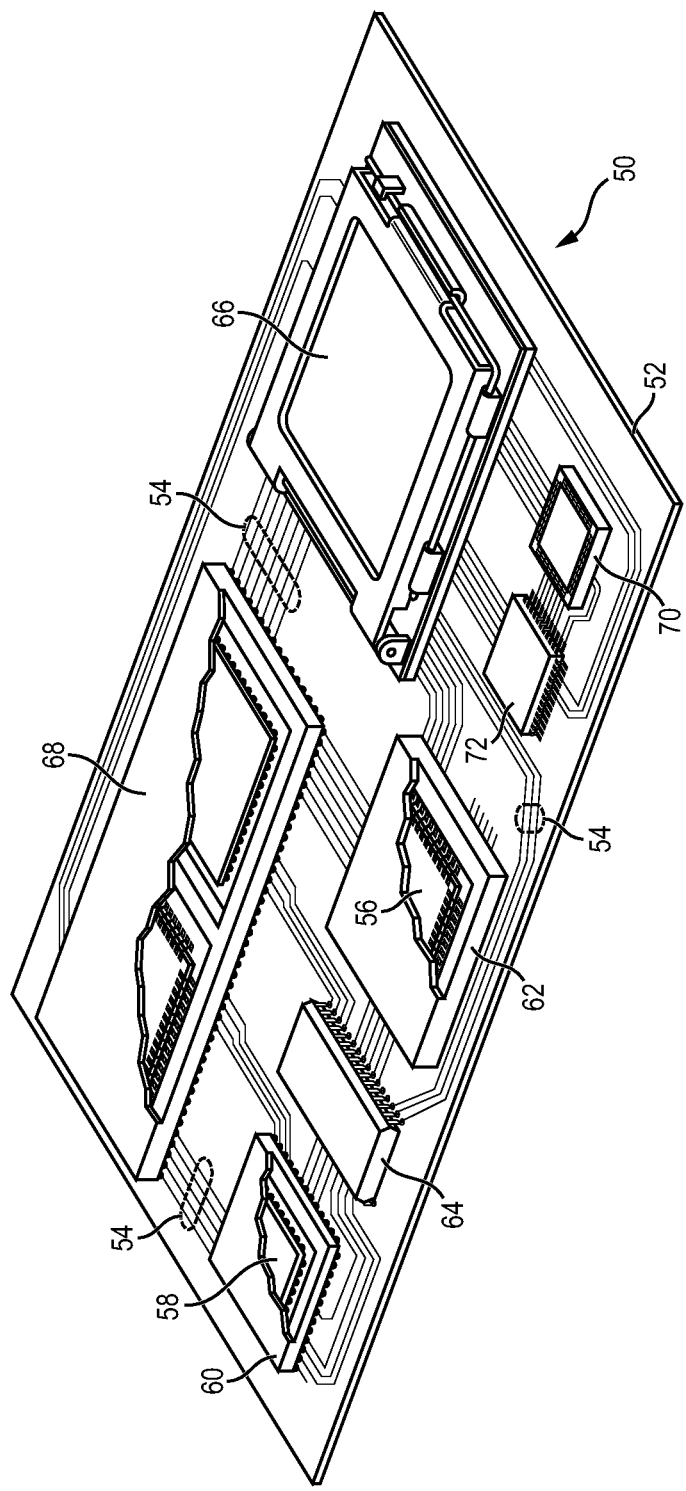
FIG. 1 illustrates a PCB with different types of packages mounted to its surface.

The present invention is described in one or more embodiments in the following description with reference to the figures, in which like numerals represent the same or similar elements. While the invention is described in terms of the best mode for achieving the invention's objectives, it will be appreciated by those skilled in the art that it is intended to cover alternatives, modifications, and equivalents as may be included within the spirit and scope of the invention as defined by the appended claims and their equivalents as supported by the following disclosure and drawings.

Semiconductor devices are generally manufactured using two complex manufacturing processes: front-end manufacturing and back-end manufacturing. Front-end manufacturing involves the formation of a plurality of die on the surface of a semiconductor wafer. Each die on the wafer contains active and passive electrical components, which are electrically connected to form functional electrical circuits. Active electrical components, such as transistors and diodes, have the ability to control the flow of electrical current. Passive electrical components, such as capacitors, inductors, resistors, and transformers, create a relationship between voltage and current necessary to perform electrical circuit functions.

Passive and active components are formed over the surface of the semiconductor wafer by a series of process steps including doping, deposition, photolithography, etching, and planarization. Doping introduces impurities into the semiconductor material by techniques such as ion implantation or thermal diffusion. The doping process modifies the electrical conductivity of semiconductor material in active devices, transforming the semiconductor material into an insulator, conductor, or dynamically changing the semiconductor material conductivity in response to an electric field or base current. Transistors contain regions of varying types and degrees of doping arranged as necessary to enable the transistor to promote or restrict the flow of electrical current upon the application of the electric field or base current.

Active and passive components are formed by layers of materials with different electrical properties. The layers can be formed by a variety of deposition techniques determined in part by the type of material being deposited. For example, thin film deposition may involve chemical vapor deposition (CVD), physical vapor deposition (PVD), electrolytic plating, and electroless plating processes. Each layer is generally patterned to form portions of active components, passive components, or electrical connections between components.

The layers can be patterned using photolithography, which involves the deposition of light sensitive material, e.g., photoresist, over the layer to be patterned. A pattern is transferred from a photomask to the photoresist using light. The portion of the photoresist pattern subjected to light is removed using a solvent, exposing portions of the underlying layer to be patterned. The remainder of the photoresist is removed, leaving behind a patterned layer. Alternatively, some types of materials are patterned by directly depositing the material into the areas or voids formed by a previous deposition/etch process using techniques such as electroless and electrolytic plating.

Depositing a thin film of material over an existing pattern can exaggerate the underlying pattern and create a non-uniformly flat surface. A uniformly flat surface is required to produce smaller and more densely packed active and passive components. Planarization can be used to remove material from the surface of the wafer and produce a uniformly flat surface. Planarization involves polishing the surface of the wafer with a polishing pad. An abrasive material and corrosive chemical are added to the surface of the wafer during polishing. The combined mechanical action of the abrasive and corrosive action of the chemical removes any irregular topography, resulting in a uniformly flat surface.

Back-end manufacturing refers to cutting or singulating the finished wafer into the individual die and then packaging the die for structural support and environmental isolation. To singulate the die, the wafer is scored and broken along non-functional regions of the wafer called saw streets or scribes. The wafer is singulated using a laser cutting tool or saw blade. After singulation, the individual die are mounted to a package substrate that includes pins or contact pads for interconnection with other system components. Contact pads formed over the semiconductor die are then connected to contact pads within the package. The electrical connections can be made with solder bumps, stud bumps, conductive paste, or wirebonds. An encapsulant or other molding material is deposited over the package to provide physical support and electrical isolation. The finished package is then inserted into an electrical system and the functionality of the semiconductor device is made available to the other system components.

FIG. 1 illustrates electronic device 50 having a chip carrier substrate or printed circuit board (PCB) 52 with a plurality of semiconductor packages mounted on its surface. Electronic device 50 may have one type of semiconductor package, or multiple types of semiconductor packages, depending on the application. The different types of semiconductor packages are shown in FIG. 1 for purposes of illustration.

Electronic device 50 may be a stand-alone system that uses the semiconductor packages to perform one or more electrical functions. Alternatively, electronic device 50 may be a sub-component of a larger system. For example, electronic device 50 may be part of a cellular phone, personal digital assistant (PDA), digital video camera (DVC), or other electronic communication device. Alternatively, electronic device 50 can be a graphics card, network interface card, or other signal processing card that can be inserted into a computer. The semiconductor package can include microprocessors, memories, application specific integrated circuits (ASIC), logic circuits, analog circuits, RF circuits, discrete devices, or other semiconductor die or electrical components. The miniaturization and the weight reduction are essential for these products to be accepted by the market. The distance between semiconductor devices must be decreased to achieve higher density.

In FIG. 1, PCB 52 provides a general substrate for structural support and electrical interconnect of the semiconductor packages mounted on the PCB. Conductive signal traces 54 are formed over a surface or within layers of PCB 52 using evaporation, electrolytic plating, electroless plating, screen printing, or other suitable metal deposition process. Signal traces 54 provide for electrical communication between each of the semiconductor packages, mounted components, and other external system components. Traces 54 also provide power and ground connections to each of the semiconductor packages.

In some embodiments, a semiconductor device has two packaging levels. First level packaging is a technique for mechanically and electrically attaching the semiconductor die to an intermediate carrier. Second level packaging involves mechanically and electrically attaching the intermediate carrier to the PCB. In other embodiments, a semiconductor device may only have the first level packaging where the die is mechanically and electrically mounted directly to the PCB.

For the purpose of illustration, several types of first level packaging, including wire bond package 56 and flip chip 58, are shown on PCB 52. Additionally, several types of second level packaging, including ball grid array (BGA) 60, bump chip carrier (BCC) 62, dual in-line package (DIP) 64, land grid array (LGA) 66, multi-chip module (MCM) 68, quad flat non-leaded package (QFN) 70, and quad flat package 72, are shown mounted on PCB 52. Depending upon the system requirements, any combination of semiconductor packages, configured with any combination of first and second level packaging styles, as well as other electronic components, can be connected to PCB 52. In some embodiments, electronic device 50 includes a single attached semiconductor package, while other embodiments call for multiple interconnected packages. By combining one or more semiconductor packages over a single substrate, manufacturers can incorporate pre-made components into electronic devices and systems. Because the semiconductor packages include sophisticated functionality, electronic devices can be manufactured using cheaper components and a streamlined manufacturing process. The resulting devices are less likely to fail and less expensive to manufacture resulting in a lower cost for consumers.

Figure 2A:
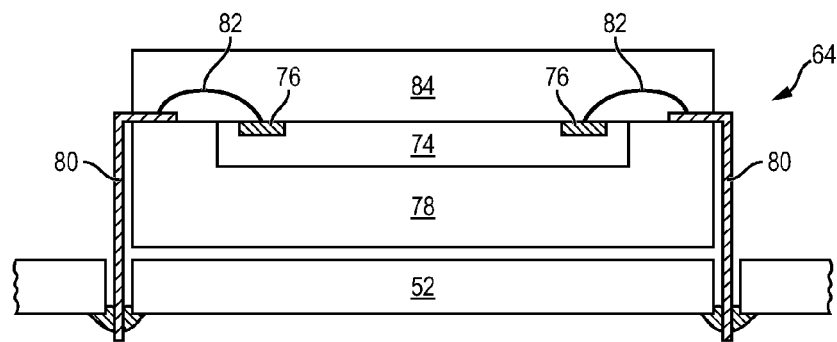
FIGS. 2a-2c illustrate further detail of the semiconductor packages mounted to the PCB.
Figure 2B:
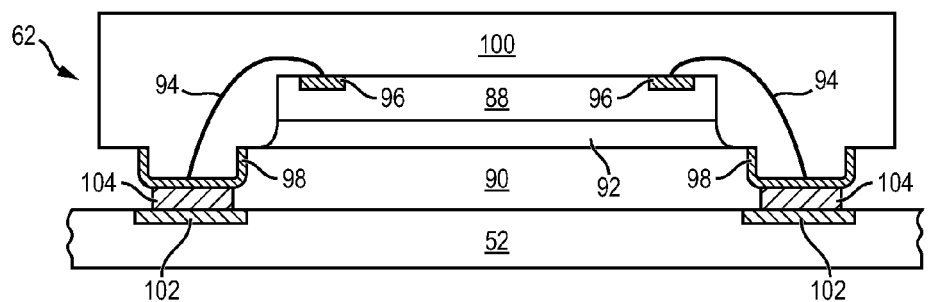
Figure 2C:
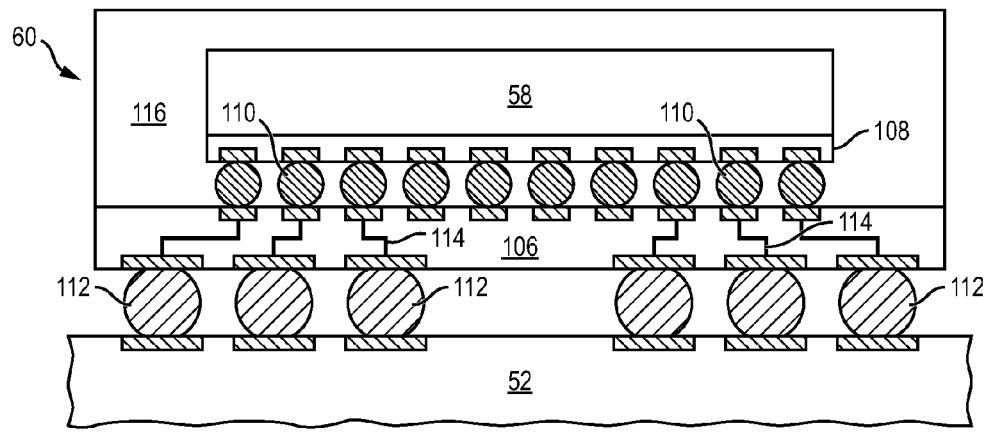

FIGS. 2a-2c show exemplary semiconductor packages. FIG. 2a illustrates further detail of DIP 64 mounted on PCB 52. Semiconductor die 74 includes an active region containing analog or digital circuits implemented as active devices, passive devices, conductive layers, and dielectric layers formed within the die and are electrically interconnected according to the electrical design of the die. For example, the circuit may include one or more transistors, diodes, inductors, capacitors, resistors, and other circuit elements formed within the active region of semiconductor die 74. Contact pads 76 are one or more layers of conductive material, such as aluminum (Al), copper (Cu), tin (Sn), nickel (Ni), gold (Au), or silver (Ag), and are electrically connected to the circuit elements formed within semiconductor die 74. During assembly of DIP 64, semiconductor die 74 is mounted to an intermediate carrier 78 using a gold-silicon eutectic layer or adhesive material such as thermal epoxy or epoxy resin. The package body includes an insulative packaging material such as polymer or ceramic. Conductor leads 80 and wire bonds 82 provide electrical interconnect between semiconductor die 74 and PCB 52. Encapsulant 84 is deposited over the package for environmental protection by preventing moisture and particles from entering the package and contaminating die 74 or wire bonds 82.

FIG. 2b illustrates further detail of BCC 62 mounted on PCB 52. Semiconductor die 88 is mounted over carrier 90 using an underfill or epoxy-resin adhesive material 92. Wire bonds 94 provide first level packaging interconnect between contact pads 96 and 98. Molding compound or encapsulant 100 is deposited over semiconductor die 88 and wire bonds 94 to provide physical support and electrical isolation for the device. Contact pads 102 are formed over a surface of PCB 52 using a suitable metal deposition process such as electrolytic plating or electroless plating to prevent oxidation. Contact pads 102 are electrically connected to one or more conductive signal traces 54 in PCB 52. Bumps 104 are formed between contact pads 98 of BCC 62 and contact pads 102 of PCB 52.

In FIG. 2c, semiconductor die 58 is mounted face down to intermediate carrier 106 with a flip chip style first level packaging. Active region 108 of semiconductor die 58 contains analog or digital circuits implemented as active devices, passive devices, conductive layers, and dielectric layers formed according to the electrical design of the die. For example, the circuit may include one or more transistors, diodes, inductors, capacitors, resistors, and other circuit elements within active region 108. Semiconductor die 58 is electrically and mechanically connected to carrier 106 through bumps 110.

BGA 60 is electrically and mechanically connected to PCB 52 with a BGA style second level packaging using bumps 112. Semiconductor die 58 is electrically connected to conductive signal traces 54 in PCB 52 through bumps 110, signal lines 114, and bumps 112. A molding compound or encapsulant 116 is deposited over semiconductor die 58 and carrier 106 to provide physical support and electrical isolation for the device. The flip chip semiconductor device provides a short electrical conduction path from the active devices on semiconductor die 58 to conduction tracks on PCB 52 in order to reduce signal propagation distance, lower capacitance, and improve overall circuit performance. In another embodiment, the semiconductor die 58 can be mechanically and electrically connected directly to PCB 52 using flip chip style first level packaging without intermediate carrier 106.

Figure 3A:
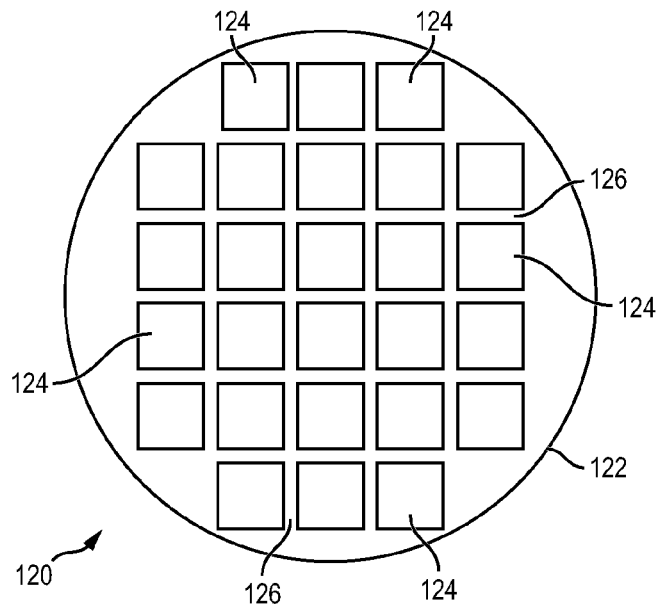
FIGS. 3a-3c illustrate a semiconductor wafer with a plurality of semiconductor die separated by saw streets.

FIG. 3a shows a semiconductor wafer 120 with a base substrate material 122, such as silicon, germanium, gallium arsenide, indium phosphide, or silicon carbide, for structural support. A plurality of semiconductor die or components 124 is formed on wafer 120 separated by saw streets 126 as described above.

Figure 3B:
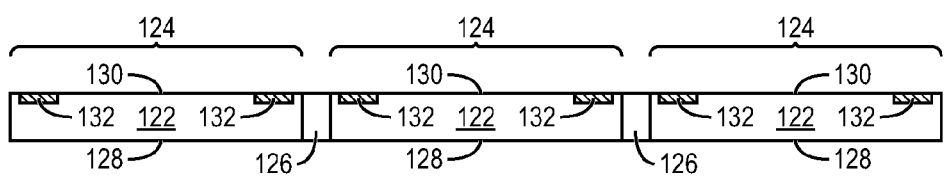

FIG. 3b shows a cross-sectional view of a portion of semiconductor wafer 120. Each semiconductor die 124 has a back surface 128 and an active surface 130 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 130 to implement analog circuits or digital circuits, such as digital signal processor (DSP), ASIC, memory, or other signal processing circuit. Semiconductor die 124 may also contain integrated passive devices (IPD), such as inductors, capacitors, and resistors, for RF signal processing. In one embodiment, semiconductor die 124 is a flipchip type semiconductor die.

An electrically conductive layer 132 is formed over active surface 130 using PVD, CVD, electrolytic plating, electroless plating process, or other suitable metal deposition process. Conductive layer 132 can be one or more layers of Al, Cu, Sn, Ni, Au, Ag, or other suitable electrically conductive material. Conductive layer 132 operates as contact pads electrically connected to the circuits on active surface 130.

Figure 3C:
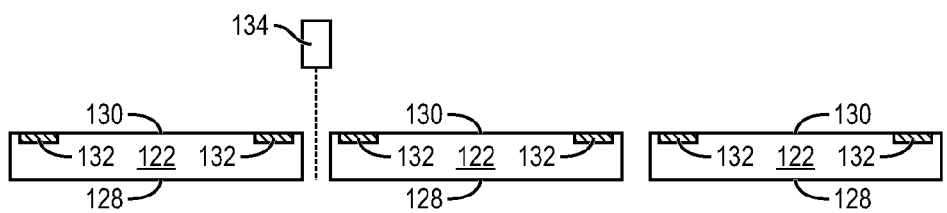

In FIG. 3c, semiconductor wafer 120 is singulated through saw street 126 using a saw blade or laser cutting tool 134 into individual semiconductor die 124.

Figure 4F:
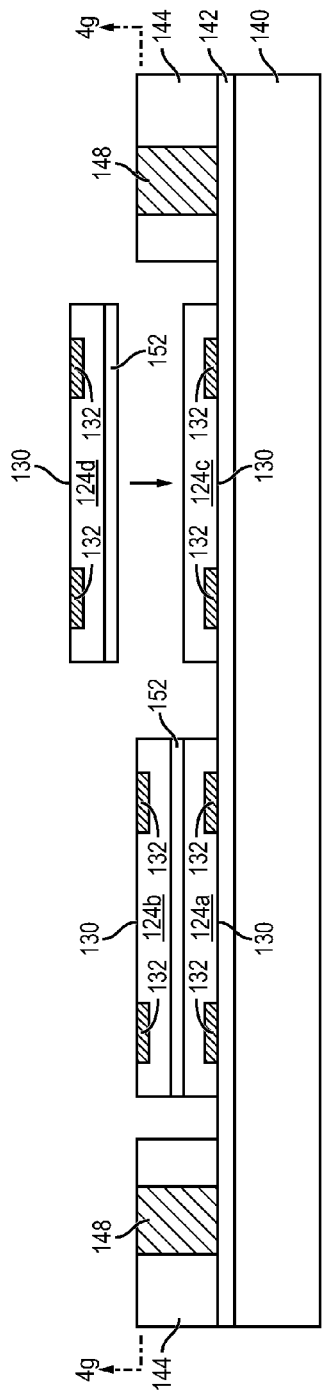

FIGS. 4a-4k illustrate, in relation to FIGS. 1 and 2a-2c, a process of forming a TSV semiconductor wafer with side-by-side stacked semiconductor die embedded within a cavity. In FIG. 4a, a substrate or carrier 140 contains temporary or sacrificial base material such as silicon, polymer, beryllium oxide, or other suitable low-cost, rigid material for structural support. An interface layer or double-sided tape 142 is formed over carrier 140 as a temporary adhesive bonding film or etch-stop layer.

FIG. 4b shows a semiconductor wafer or die 144 with a base substrate material 146, such as silicon, germanium, gallium arsenide, indium phosphide, or silicon carbide, for structural support. Semiconductor wafer or die 144 can be a single crystalline material or casted poly-crystal material with cavities created in casting.

A plurality of vias is formed in semiconductor wafer 144 using laser drilling, mechanical drilling, or deep reactive ion etching (DRIE). The vias are filled with Al, Cu, Sn, Ni, Au, Ag, titanium (Ti), tungsten (W), poly-silicon, or other suitable electrically conductive material using electrolytic plating, electroless plating process, or other suitable metal deposition process to form z-direction vertical interconnect conductive through silicon vias (TSV) 148. Semiconductor wafer 144 is mounted to interface layer 142 over carrier 140, as shown in FIG. 4c. In another embodiment, a portion of PCB board with interconnect circuit and through hole interconnect can be mounted to carrier 140.

In FIG. 4d, a cavity 150 is formed in semiconductor wafer 144 between conductive TSV 148 down to interface layer 142 using an etching process, e.g., batch wet etching. Cavity 150 is sufficiently wide and deep to contain multiple stacks of semiconductor die. Alternatively, semiconductor wafer 144 can be pre-formed with cavity 150.

In FIG. 4e, semiconductor die 124 from FIG. 3a-3c are mounted over interface layer 142 within cavity 150. In particular, semiconductor die 124a is mounted to interface layer 142 with active surface 130 oriented toward carrier 140. Semiconductor die 124b is mounted back-to-back to semiconductor die 124a. The active surface 130 of semiconductor die 124b is oriented away from carrier 140. Accordingly, contact pads 132 of semiconductor die 124a are oriented toward carrier 140 and contact pads 132 of semiconductor die 124b are oriented in an opposite direction away from carrier 140. The back surface 128 of semiconductor die 124a is secured to back surface 128 of semiconductor die 124b with die attach adhesive layer 152. Semiconductor die 124a may have a different electrical function than semiconductor die 124b.

Semiconductor die 124c is mounted to interface layer 142 with active surface 130 oriented toward carrier 140. In FIG. 4f, semiconductor die 124d is mounted back-to-back to semiconductor die 124c. The active surface 130 of semiconductor die 124d is oriented away from carrier 140. Accordingly, contact pads 132 of semiconductor die 124c are oriented toward carrier 140 and contact pads 132 of semiconductor die 124d are oriented in an opposite direction away from carrier 140. The back surface 128 of semiconductor die 124c is secured to back surface 128 of semiconductor die 124d with die attach adhesive layer 152. Semiconductor die 124c may have a different electrical function than semiconductor die 124d. Although FIGS. 4e and 4f show two side-by-side stacked semiconductor die 124a-124b and 124c-124d, additional semiconductor die can be mounted within cavity 150 in a stacked arrangement and/or side-by-side arrangement. Semiconductor die 124a-124d can be same size die or different size die.

Figure 4G:
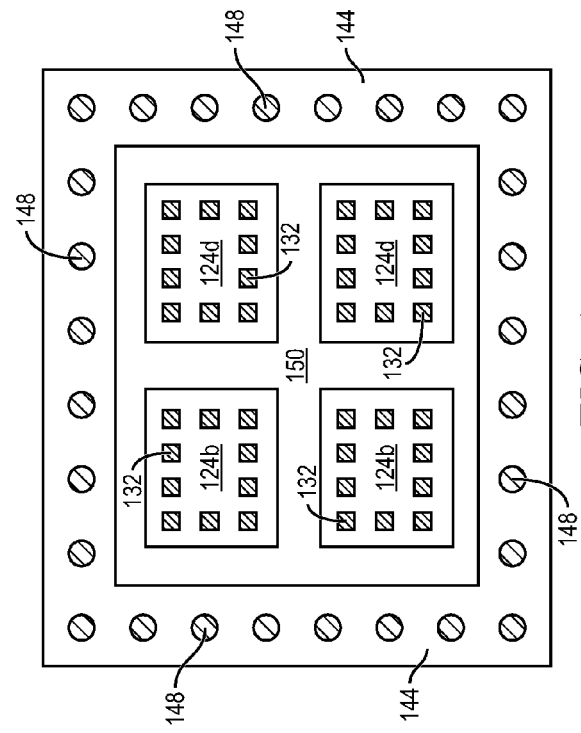

FIG. 4g shows a top view of semiconductor wafer 144 with cavity 150 containing semiconductor die 124 and conductive TSV 148 disposed around the cavity. Multiple rows of conductive TSV 148 can be formed around cavity 150.

In FIG. 4h, an encapsulant or molding compound 154 is deposited within cavity 150 around the stacked semiconductor die 124 using a paste printing, compressive molding, transfer molding, liquid encapsulant molding, vacuum lamination, spin coating, or other suitable applicator. Encapsulant 154 can be polymer composite material, such as epoxy resin with filler, epoxy acrylate with filler, or polymer with proper filler. Encapsulant 154 is non-conductive and environmentally protects the semiconductor device from external elements and contaminants. Semiconductor die 124a and 124c can be mounted to wettable contact pads formed over carrier 140 to reduce die shifting during encapsulation.

In FIG. 4i, an insulating or passivation layer 156 is formed over semiconductor die 124b and 124d, semiconductor wafer 144, conductive TSV 148, and encapsulant 154 using PVD, CVD, printing, spin coating, spray coating, sintering or thermal oxidation. The insulating layer 156 contains one or more layers of silicon dioxide ($SiO_2$), silicon nitride ($Si_3N_4$), silicon oxynitride (SiON), tantalum pentoxide ($Ta_2O_5$), aluminum oxide ($Al_2O_3$), or other material having similar insulating and structural properties. A portion of insulating layer 156 is removed by an etching process to expose contact pads 132 of semiconductor die 124b and 124d and conductive TSV 148.

An electrically conductive layer or redistribution layer (RDL) 158 is formed over contact pads 132 of semiconductor die 124b and 124d, conductive TSV 148, and insulating layer 156 using a patterning and metal deposition process such as printing, PVD, CVD, sputtering, electrolytic plating, and electroless plating. Conductive layer 158 can be one or more layers of Al, Cu, Sn, Ni, Au, Ag, or other suitable electrically conductive material. One portion of conductive layer 158 is electrically connected to contact pads 132 of semiconductor die 124b and 124d. Another portion of conductive layer 158 is electrically connected to conductive TSV 148. Other portions of conductive layer 158 can be electrically common or electrically isolated depending on the design and function of semiconductor die 124.

An insulating or passivation layer 160 is formed over insulating layer 156 and conductive layer 158 using PVD, CVD, printing, spin coating, spray coating, sintering or thermal oxidation. The insulating layer 160 contains one or more layers of SiO2, Si3N4, SiON, Ta2O5, Al2O3, or other material having similar insulating and structural properties. A portion of insulating layer 160 is removed by an etching process to expose conductive layer 158 for additional electrical interconnect. The insulating layers 156 and 160 and conductive layer 158 constitute build-up interconnect structure 161.

Figure 4J:
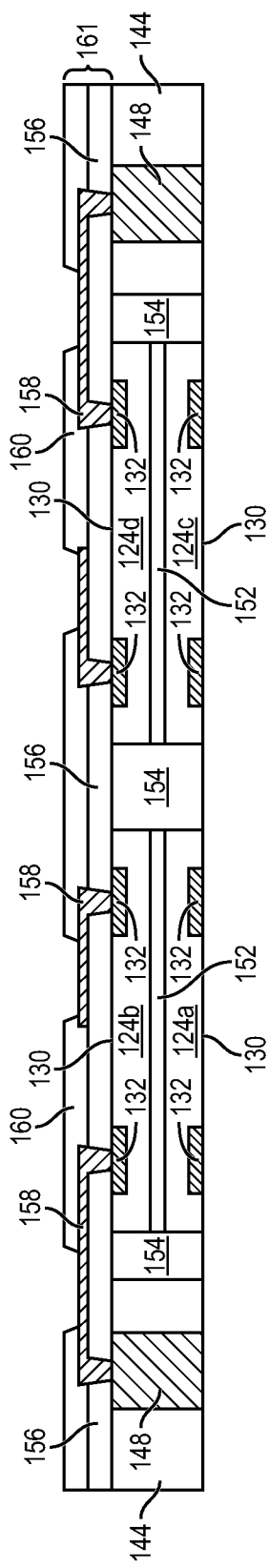

In FIG. 4j, carrier 140 and interface layer 142 are removed by chemical etching, mechanical peeling, CMP, mechanical grinding, thermal bake, UV light, laser scanning, or wet stripping to expose semiconductor die 124a and 124c, semiconductor wafer 144, conductive TSV 148, and encapsulant 154.

Figure 4K:
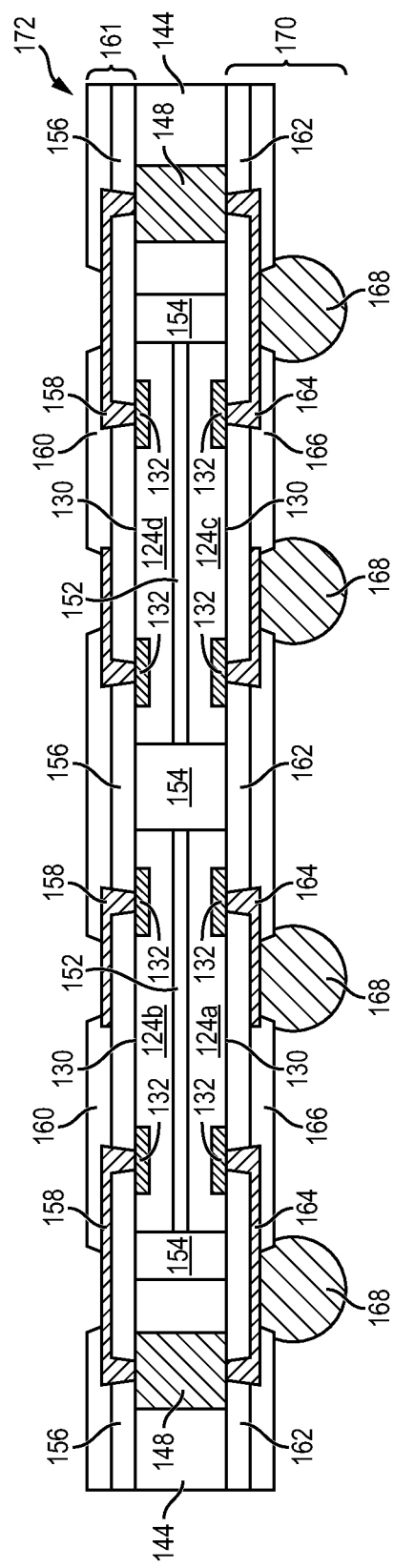

In FIG. 4k, an insulating or passivation layer 162 is formed over semiconductor die 124a and 124c, semiconductor wafer 144, conductive TSV 148, and encapsulant 154 using PVD, CVD, printing, spin coating, spray coating, sintering or thermal oxidation. The insulating layer 162 contains one or more layers of SiO2, Si3N4, SiON, Ta2O5, Al2O3, or other material having similar insulating and structural properties. A portion of insulating layer 162 is removed by an etching process to expose contact pads 132 of semiconductor die 124a and 124c and conductive TSV 148.

An electrically conductive layer or RDL 164 is formed over contact pads 132 of semiconductor die 124a and 124c, conductive TSV 148, and insulating layer 156 using a patterning and metal deposition process such as printing, PVD, CVD, sputtering, electrolytic plating, and electroless plating. Conductive layer 164 can be one or more layers of Al, Cu, Sn, Ni, Au, Ag, or other suitable electrically conductive material. One portion of conductive layer 164 is electrically connected to contact pads 132 of semiconductor die 124a and 124c. Another portion of conductive layer 164 is electrically connected to conductive TSV 148. Other portions of conductive layer 164 can be electrically common or electrically isolated depending on the design and function of semiconductor die 124.

An insulating or passivation layer 166 is formed over insulating layer 162 and conductive layer 164 using PVD, CVD, printing, spin coating, spray coating, sintering or thermal oxidation. The insulating layer 166 contains one or more layers of SiO2, Si3N4, SiON, Ta2O5, Al2O3, or other material having similar insulating and structural properties. A portion of insulating layer 166 is removed by an etching process to expose conductive layer 164.

An electrically conductive bump material is deposited over conductive layer 164 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 164 using a suitable attachment or bonding process. In one embodiment, the bump material is reflowed by heating the material above its melting point to form spherical balls or bumps 168. In some applications, bumps 168 are reflowed a second time to improve electrical contact to conductive layer 164. The bumps can also be compression bonded to conductive layer 164. The insulating layers 162 and 166, conductive layer 164, and bumps 168 constitute build-up interconnect structure 170. The interconnect structure can also use bond wires, conductive paste, stud bump, micro bump, or other electrical interconnect.

The structure of FIG. 4k represents Fo-WLCSP 172 as a reconfigured wafer. Semiconductor die 124a and 124c are electrically connected through build-up interconnect structure 170 to conductive TSV 148 and build-up interconnect structure 161. Semiconductor die 124b and 124d are electrically connected through build-up interconnect structure 161 to conductive TSV 148 and build-up interconnect structure 170. The CTE of semiconductor wafer 144 is selected similar to the CTE of carrier 140 and CTE of encapsulant 154 to reduce warpage during encapsulation. The CTE of semiconductor die 124 is selected similar to the CTE of encapsulant 154 to reduce delamination between the semiconductor die and encapsulant. Conductive TSV 148 provide z-direction vertical electrical interconnect for semiconductor die 124.

Figure 5:
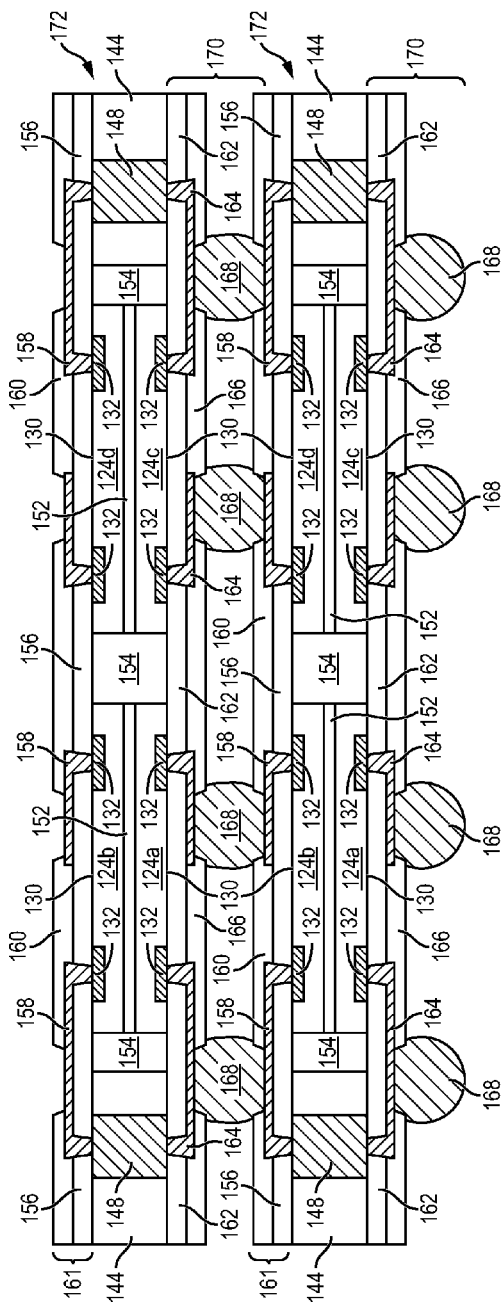
FIG. 5 illustrates stacked Fo-WLCSP each having a TSV semiconductor wafer with side-by-side stacked semiconductor die embedded within a cavity.

FIG. 5 shows a plurality of stacked Fo-WLCSP 172 electrically connected through build-up interconnect structures 161 and 170 and conductive TSV 148.

Figure 6:
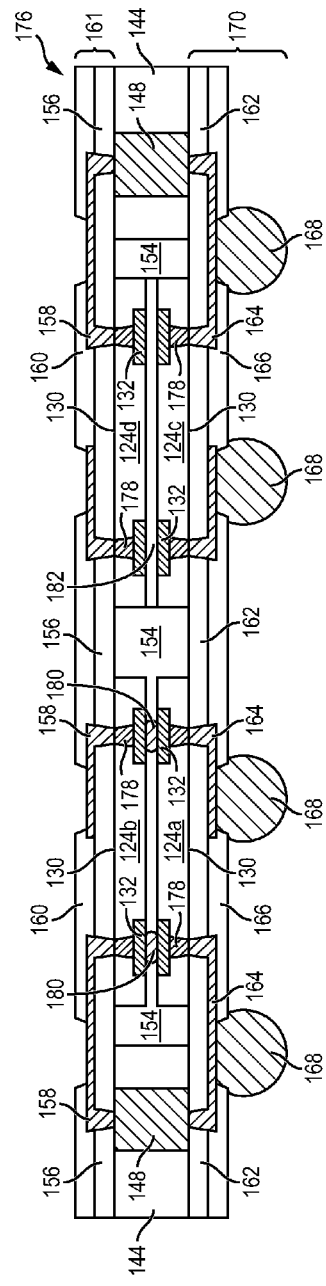
FIG. 6 illustrates the TSV semiconductor wafer with side-by-side stacked face-to-face semiconductor die embedded within a cavity.

FIG. 6 shows an embodiment of Fo-WLCSP 176, similar to FIG. 4k, with semiconductor die 124a-124d stacked active surface-to-active surface. A plurality of vias is formed in semiconductor die 124 while in wafer form, see FIG. 3a, using laser drilling, mechanical drilling, or DRIE. The vias are filled with Al, Cu, Sn, Ni, Au, Ag, Ti, W, poly-silicon, or other suitable electrically conductive material using electrolytic plating, electroless plating process, or other suitable metal deposition process to form conductive TSV 178. Conductive TSV 178 provide z-direction vertical electrical interconnect for semiconductor die 124. Bumps 180 are electrically connected between adjacent contact pads 132 of semiconductor die 124a and 124b. Bumps 180 can also be electrically connected between adjacent contact pads 132 of semiconductor die 124c and 124d. Alternatively, a b-stage backside coating 182 is formed between semiconductor die 124a and 124b and/or semiconductor die 124c and 124d.

Figure 7:
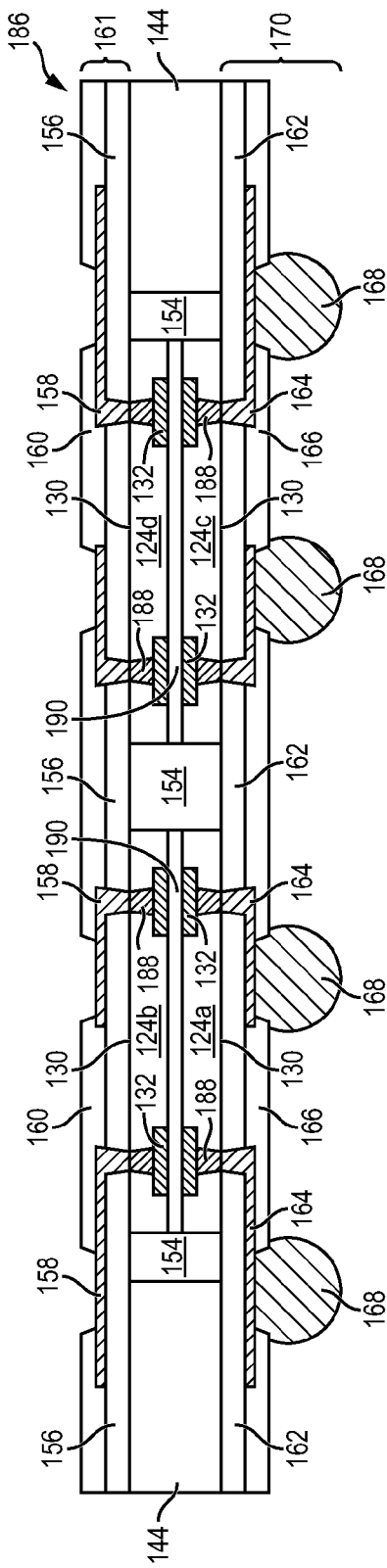
FIG. 7 illustrates a semiconductor wafer with side-by-side stacked face-to-face semiconductor die embedded within a cavity.

FIG. 7 shows an embodiment of Fo-WLCSP 186, similar to FIG. 6, without conductive TSV 148. Conductive TSV 188 provide z-direction vertical electrical interconnect between contact pads 132 of semiconductor die 124a and 124c and build-up interconnect layer 170. Conductive TSV 188 also provide z-direction vertical electrical interconnect between contact pads 132 of semiconductor die 124b and 124d and build-up interconnect layer 161. A b-stage backside coating 190 is formed between semiconductor die 124a and 124b and between semiconductor die 124c and 124d. Alternatively, bumps can be formed between adjacent contact pads 132 of semiconductor die 124a-124d.

Figure 8:
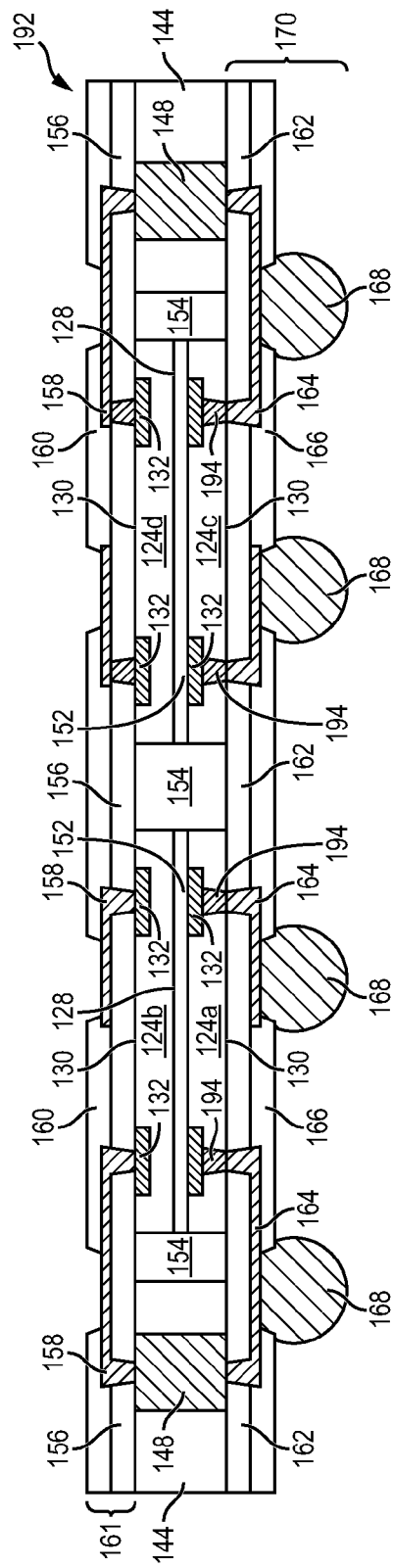
FIG. 8 illustrates the TSV semiconductor wafer with side-by-side stacked back-to-face semiconductor die embedded within a cavity.

FIG. 8 shows an embodiment of Fo-WLCSP 192, similar to FIG. 4k, with semiconductor die 124a-124d stacked active surface-to-back surface. A plurality of vias is formed in semiconductor die 124a and 124c while in wafer form, see FIG. 3a-3c, using laser drilling, mechanical drilling, or DRIE. The vias are filled with Al, Cu, Sn, Ni, Au, Ag, Ti, W, poly-silicon, or other suitable electrically conductive material using electrolytic plating, electroless plating process, or other suitable metal deposition process to form conductive TSV 194. Conductive TSV 194 provide z-direction vertical electrical interconnect for semiconductor die 124a and 124c. Contact pads 132 of semiconductor die 124b and 124d are electrically connected to conductive layer 158 of build-up interconnect structure 161.

FIG. 9 shows an embodiment of Fo-WLCSP 200, similar to FIG. 4k, with contact pads 132 of semiconductor die 124b and 124d electrically connected to conductive layer 158 of build-up interconnect structure 161 with bumps 202 and conductive through mold vias (TMV) 204, respectively. Bumps 202 are formed over contact pads 132 of semiconductor die 124b while in wafer form, see FIG. 3a-3c, and mounted to semiconductor die 124a accordingly. Cavity 150 is deeper than the combined height of semiconductor die 124a-124d so that encapsulant 154 covers semiconductor die 124b and 124d. A plurality of vias is formed through encapsulant 154 prior to forming build-up interconnect structure 161 using laser drilling, mechanical drilling, or DRIE. The vias are filled with Al, Cu, Sn, Ni, Au, Ag, Ti, W, poly-silicon, or other suitable electrically conductive material using electrolytic plating, electroless plating process, or other suitable metal deposition process to form conductive TMV 204. Conductive TMV 204 provide z-direction vertical electrical interconnect between contact pads 132 of semiconductor die 124*d* and conductive layer 158. Bumps 202 and conductive TMV 204 can also be formed over semiconductor die 124*a* and 124*c*.

FIG. 10 shows an embodiment of Fo-WLCSP 210, similar to FIG. 4*k*, with single semiconductor die 124 (non-stacked) mounted side-by-side within cavity 150 and surrounded by encapsulant 154. The active surfaces 130 of semiconductor die 124*a* and 124*c* face opposite directions. Contact pads 132 of semiconductor die 124*a* are electrically connected to conductive layer 164 of build-up interconnect structure 170. Contact pads 132 of semiconductor die 124*c* are electrically connected to conductive layer 158 of build-up interconnect structure 161.

FIG. 11 shows an embodiment of Fo-WLCSP 214, similar to FIG. 4*k*, with semiconductor die 216 having an active surface 218 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 218 to implement analog circuits or digital circuits, such as DSP, ASIC, memory, or other signal processing circuit. Semiconductor die 216 may also contain IPDs, such as inductors, capacitors, and resistors, for RF signal processing. In one embodiment, semiconductor die 216 is a flipchip type semiconductor die. Contact pads 220 are formed in active surface 218 and electrically connected to the circuits on the active surface. Bumps 222 are formed over contact pads 220. Semiconductor die is mounted to build-up interconnect structure 161 with bumps 222 metallurgically and electrically connected to the exposed conductive layer 158 of build-up interconnect structure 161.

An encapsulant or molding compound 224 is deposited over semiconductor die 216 and build-up interconnect structure 161 using a paste printing, compressive molding, transfer molding, liquid encapsulant molding, vacuum lamination, spin coating, or other suitable applicator. Encapsulant 224 can be polymer composite material, such as epoxy resin with filler, epoxy acrylate with filler, or polymer with proper filler. Encapsulant 224 is non-conductive and environmentally protects the semiconductor device from external elements and contaminants.

A plurality of vias is formed through encapsulant 224 around or adjacent to semiconductor die 216 using laser drilling, mechanical drilling, or DRIE. The vias are filled with Al, Cu, Sn, Ni, Au, Ag, Ti, W, poly-silicon, or other suitable electrically conductive material using electrolytic plating, electroless plating process, or other suitable metal deposition process to form conductive TMV 226. Conductive TMV 178 provide z-direction vertical electrical interconnect to conductive layer 158 in build-up interconnect structure 161.

FIG. 12 shows an embodiment of Fo-WLCSP 230, continuing from FIG. 4*c*, with cavities 232 and 234 formed in opposite surfaces of semiconductor wafer 144. In one embodiment, cavity 232 is formed in surface 233 of semiconductor wafer 144 to a depth less than one half the thickness of the semiconductor wafer using an etching process, e.g., batch wet etching. Likewise, cavity 234 is formed in surface 235 of semiconductor wafer 144 to a depth less than one half the thickness of the semiconductor wafer using an etching process, e.g., batch wet etching. Since each cavity 232 and 234 is formed less than one half a thickness of semiconductor wafer 144, a portion of semiconductor wafer 144 remains separating cavities 232 and 234. Cavities 232 and 234 are sufficiently wide and deep to contain a semiconductor die.

Semiconductor die 124 are mounted within cavities 232 and 234. In particular, semiconductor die 124*a* and 124*c* are mounted within cavity 232 with back surfaces 128 oriented toward semiconductor wafer 144. Semiconductor die 124*b* and 124*d* are mounted within cavity 234 with back surfaces 128 oriented toward semiconductor wafer 144. The back surfaces 128 of semiconductor die 124*a*-124*d* are secured within cavities 232 and 234 to semiconductor wafer 144 with die attach adhesive 236. Semiconductor die 124*a*-124*d* may each have a different size and electrical function.

An encapsulant or molding compound 238 is deposited within cavities 232 and 234 around semiconductor die 124*a*-124*d* using a paste printing, compressive molding, transfer molding, liquid encapsulant molding, vacuum lamination, spin coating, or other suitable applicator. Encapsulant 238 can be polymer composite material, such as epoxy resin with filler, epoxy acrylate with filler, or polymer with proper filler. Encapsulant 238 is non-conductive and environmentally protects the semiconductor device from external elements and contaminants.

An insulating or passivation layer 240 is formed over semiconductor die 124*b* and 124*d*, semiconductor wafer 144, conductive TSV 148, and encapsulant 238 using PVD, CVD, printing, spin coating, spray coating, sintering or thermal oxidation. The insulating layer 240 contains one or more layers of $SiO_2$, $Si_3N_4$, SiON, $Ta_2O_5$, $Al_2O_3$, or other material having similar insulating and structural properties. A portion of insulating layer 240 is removed by an etching process to expose contact pads 132 of semiconductor die 124*b* and 124*d* and conductive TSV 148.

An electrically conductive layer or RDL 242 is formed over contact pads 132 of semiconductor die 124*b* and 124*d*, conductive TSV 148, and insulating layer 240 using a patterning and metal deposition process such as printing, PVD, CVD, sputtering, electrolytic plating, and electroless plating. Conductive layer 242 can be one or more layers of Al, Cu, Sn, Ni, Au, Ag, or other suitable electrically conductive material. One portion of conductive layer 242 is electrically connected to contact pads 132 of semiconductor die 124*b* and 124*d*. Another portion of conductive layer 242 is electrically connected to conductive TSV 148. Other portions of conductive layer 242 can be electrically common or electrically isolated depending on the design and function of semiconductor die 124.

An insulating or passivation layer 244 is formed over insulating layer 240 and conductive layer 242 using PVD, CVD, printing, spin coating, spray coating, sintering or thermal oxidation. The insulating layer 244 contains one or more layers of $SiO_2$, $Si_3N_4$, SiON, $Ta_2O_5$, $Al_2O_3$, or other material having similar insulating and structural properties. A portion of insulating layer 244 is removed by an etching process to expose conductive layer 242 for additional electrical interconnect. The insulating layers 240 and 244 and conductive layer 242 constitute an interconnect structure 246.

An insulating or passivation layer 248 is formed over semiconductor die 124*a* and 124*c*, semiconductor wafer 144, conductive TSV 148, and encapsulant 238 using PVD, CVD, printing, spin coating, spray coating, sintering or thermal oxidation. The insulating layer 248 contains one or more layers of $SiO_2$, $Si_3N_4$, SiON, $Ta_2O_5$, $Al_2O_3$, or other material having similar insulating and structural properties. A portion of insulating layer 248 is removed by an etching process to expose contact pads 132 of semiconductor die 124a and 124c and conductive TSV 148.

An electrically conductive layer or RDL 250 is formed over contact pads 132 of semiconductor die 124a and 124c, conductive TSV 148, and insulating layer 248 using a patterning and metal deposition process such as printing, PVD, CVD, sputtering, electrolytic plating, and electroless plating. Conductive layer 250 can be one or more layers of Al, Cu, Sn, Ni, Au, Ag, or other suitable electrically conductive material. One portion of conductive layer 250 is electrically connected to contact pads 132 of semiconductor die 124a and 124c. Another portion of conductive layer 250 is electrically connected to conductive TSV 148. Other portions of conductive layer 250 can be electrically common or electrically isolated depending on the design and function of semiconductor die 124.

An insulating or passivation layer 252 is formed over insulating layer 248 and conductive layer 250 using PVD, CVD, printing, spin coating, spray coating, sintering or thermal oxidation. The insulating layer 252 contains one or more layers of SiO2, Si3N4, SiON, Ta2O5, Al2O3, or other material having similar insulating and structural properties. A portion of insulating layer 252 is removed by an etching process to expose conductive layer 250.

An electrically conductive bump material is deposited over conductive layer 250 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 250 using a suitable attachment or bonding process. In one embodiment, the bump material is reflowed by heating the material above its melting point to form spherical balls or bumps 254. In some applications, bumps 254 are reflowed a second time to improve electrical contact to conductive layer 250. The bumps can also be compression bonded to conductive layer 250. The insulating layers 248 and 252, conductive layer 250, and bumps 254 constitute build-up interconnect structure 256. The interconnect structure can also use bond wires, conductive paste, stud bump, micro bump, or other electrical interconnect.

Fo-WLCSP 230 represents a reconfigured wafer. Semiconductor die 124a and 124c are electrically connected through build-up interconnect structure 256 to conductive TSV 148 and build-up interconnect structure 246. Semiconductor die 124b and 124d are electrically connected through build-up interconnect structure 246 to conductive TSV 148 and build-up interconnect structure 256. The CTE of semiconductor wafer 144 is selected similar to the CTE of semiconductor die 124 and encapsulant 154 to reduce warpage and delamination between the semiconductor die and encapsulant. Conductive TSV 148 provide z-direction vertical electrical interconnect for semiconductor die 124.

While one or more embodiments of the present invention have been illustrated in detail, the skilled artisan will appreciate that modifications and adaptations to those embodiments may be made without departing from the scope of the present invention as set forth in the following claims.

What is claimed:

1. A method of making a semiconductor device, comprising:
    providing a semiconductor wafer including a plurality of conductive vias formed through the semiconductor wafer;
    forming a cavity in the semiconductor wafer between the conductive vias;
    disposing a plurality of semiconductor die within the cavity of the semiconductor wafer;
    depositing an encapsulant within the cavity over the semiconductor die;
    forming a first interconnect structure over a first surface of the semiconductor wafer; and
    forming a second interconnect structure over a second surface of the semiconductor wafer opposite the first surface, the first and second interconnect structures being electrically connected to the conductive vias.

2. The method of claim 1, wherein a coefficient of thermal expansion of the semiconductor wafer is similar to a coefficient of thermal expansion of the encapsulant.

3. The method of claim 1, wherein a coefficient of thermal expansion of the semiconductor die is similar to a coefficient of thermal expansion of the encapsulant.

4. The method of claim 1, further including disposing the semiconductor die in a stacked arrangement.

5. The method of claim 4, further including disposing bumps between the stacked semiconductor die.

6. The method of claim 1, further including disposing the semiconductor die in a side-by-side arrangement within the cavity of the semiconductor wafer.

7. The method of claim 1, further including:
    stacking a plurality of the semiconductor devices; and
    electrically connecting the stacked semiconductor devices through the first and second interconnect structures and conductive vias.

8. A method of making a semiconductor device, comprising:
    providing a semiconductor wafer;
    forming a first cavity in a first surface of the semiconductor wafer;
    disposing a first semiconductor die within the first cavity of the semiconductor wafer;
    depositing a first encapsulant within the first cavity;
    forming a first interconnect structure over the first surface of the semiconductor wafer; and
    forming a second interconnect structure over a second surface of the semiconductor wafer opposite the first surface of the semiconductor wafer.

9. The method of claim 8, further including forming a plurality of conductive vias through the semiconductor wafer.

10. The method of claim 8, wherein a coefficient of thermal expansion of the semiconductor wafer and coefficient of thermal expansion of the first semiconductor die are similar to a coefficient of thermal expansion of the first encapsulant.

11. The method of claim 8, further including:
    forming a second cavity in the second surface of the semiconductor wafer opposite the first surface of the semiconductor wafer;
    disposing a second semiconductor die within the second cavity of the semiconductor wafer; and
    depositing a second encapsulant within the second cavity.

12. The method of claim 8, further including forming a plurality of conductive vias through the first semiconductor die.

13. The method of claim 8, further including:
    disposing a second semiconductor die over the first interconnect structure; and
    depositing a second encapsulant over the second semiconductor die and first interconnect structure.

14. A method of making a semiconductor device, comprising:
    providing a substrate including a plurality of first conductive vias formed through the substrate;
    forming a first cavity in a first surface of the substrate;

disposing a first semiconductor die within the first cavity of the substrate;

depositing a first encapsulant within the first cavity; and forming a first interconnect structure over the first surface of the substrate, the first interconnect structure being electrically connected to the first conductive vias.

15. The method of claim 14, further including forming a second interconnect structure over a second surface of the substrate opposite the first surface of the substrate, the second interconnect structure being electrically connected to the first conductive vias.

16. The method of claim 14, wherein a coefficient of thermal expansion of the substrate and coefficient of thermal expansion of the first semiconductor die are similar to a coefficient of thermal expansion of the first encapsulant.

17. The method of claim 14, further including:
forming a second cavity in a second surface of the substrate opposite the first surface of the substrate;
disposing a second semiconductor die within the second cavity of the substrate; and
depositing a second encapsulant within the second cavity over the second semiconductor die.

18. The method of claim 14, further including forming a plurality of second conductive vias through the first semiconductor die.

19. The method of claim 14, further including disposing a second semiconductor die over the first semiconductor die.

20. The method of claim 14, further including:
disposing a second semiconductor die over the first interconnect structure; and
depositing a second encapsulant over the second semiconductor die and first interconnect structure.

* * * * *